(12) United States Patent
Nandakumar

(10) Patent No.: US 9,455,252 B2
(45) Date of Patent: Sep. 27, 2016

(54) COMBINING ZTCR RESISTOR WITH LASER ANNEAL FOR HIGH PERFORMANCE PMOS TRANSISTOR

(71) Applicant: Texas Instruments Incorporated, Dallas, TX (US)

(72) Inventor: Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/875,274

(22) Filed: Oct. 5, 2015

(65) Prior Publication Data

US 2016/0035720 A1 Feb. 4, 2016

Related U.S. Application Data

(63) Continuation of application No. 13/709,961, filed on Dec. 10, 2012, now Pat. No. 9,190,277.

(60) Provisional application No. 61/568,415, filed on Dec. 8, 2011.

(51) Int. Cl.
| H01L 21/425 | (2006.01) |
| H01L 27/07 | (2006.01) |
| H01L 21/265 | (2006.01) |
| H01L 21/8234 | (2006.01) |
| H01L 27/06 | (2006.01) |
| H01L 21/225 | (2006.01) |
| H01L 21/8238 | (2006.01) |
| H01L 49/02 | (2006.01) |

(52) U.S. Cl.
CPC ....... *H01L 27/0738* (2013.01); *H01L 21/2253* (2013.01); *H01L 21/26513* (2013.01); *H01L 21/823412* (2013.01); *H01L 21/823418* (2013.01); *H01L 21/823814* (2013.01); *H01L 27/0629* (2013.01); *H01L 28/20* (2013.01)

(58) Field of Classification Search
None
See application file for complete search history.

(56) References Cited

U.S. PATENT DOCUMENTS

| 5,554,873 A * | 9/1996 | Erdeljac | H01L 21/32155 257/359 |
| 6,730,554 B1 | 5/2004 | Baldwin et al. | |
| 8,536,034 B2 | 9/2013 | Flachowsky et al. | |
| 2006/0008964 A1 | 1/2006 | Mineji | |
| 2006/0166457 A1* | 7/2006 | Liu | H01L 27/0629 438/400 |
| 2007/0293012 A1* | 12/2007 | Jain | H01L 21/324 438/308 |
| 2009/0047768 A1* | 2/2009 | Jain | H01L 21/2251 438/306 |
| 2010/0025744 A1 | 2/2010 | Miyashita et al. | |
| 2010/0035401 A1* | 2/2010 | Lai | H01L 21/28518 438/301 |
| 2010/0075499 A1 | 3/2010 | Olsen | |
| 2010/0255668 A1* | 10/2010 | Nomura | H01L 21/82385 438/587 |
| 2011/0070703 A1* | 3/2011 | Xiong | H01L 21/823807 438/231 |
| 2012/0049297 A1* | 3/2012 | Takeoka | H01L 21/02181 257/410 |
| 2012/0098071 A1 | 4/2012 | Aggarwal et al. | |

* cited by examiner

Primary Examiner — John C Ingham
Assistant Examiner — Ismail Muse
(74) Attorney, Agent, or Firm — Jacqueline J. Garner; Frank D. Cimino

(57) ABSTRACT

An integrated circuit containing a PMOS transistor may be formed by implanting boron in the p-channel source drain (PSD) implant step at a dose consistent with effective channel length control, annealing the PSD implant, and subsequently concurrently implanting boron into a polysilicon resistor with a zero temperature coefficient of resistance using an implant mask which also exposes the PMOS transistor, followed by a millisecond anneal.

16 Claims, 17 Drawing Sheets

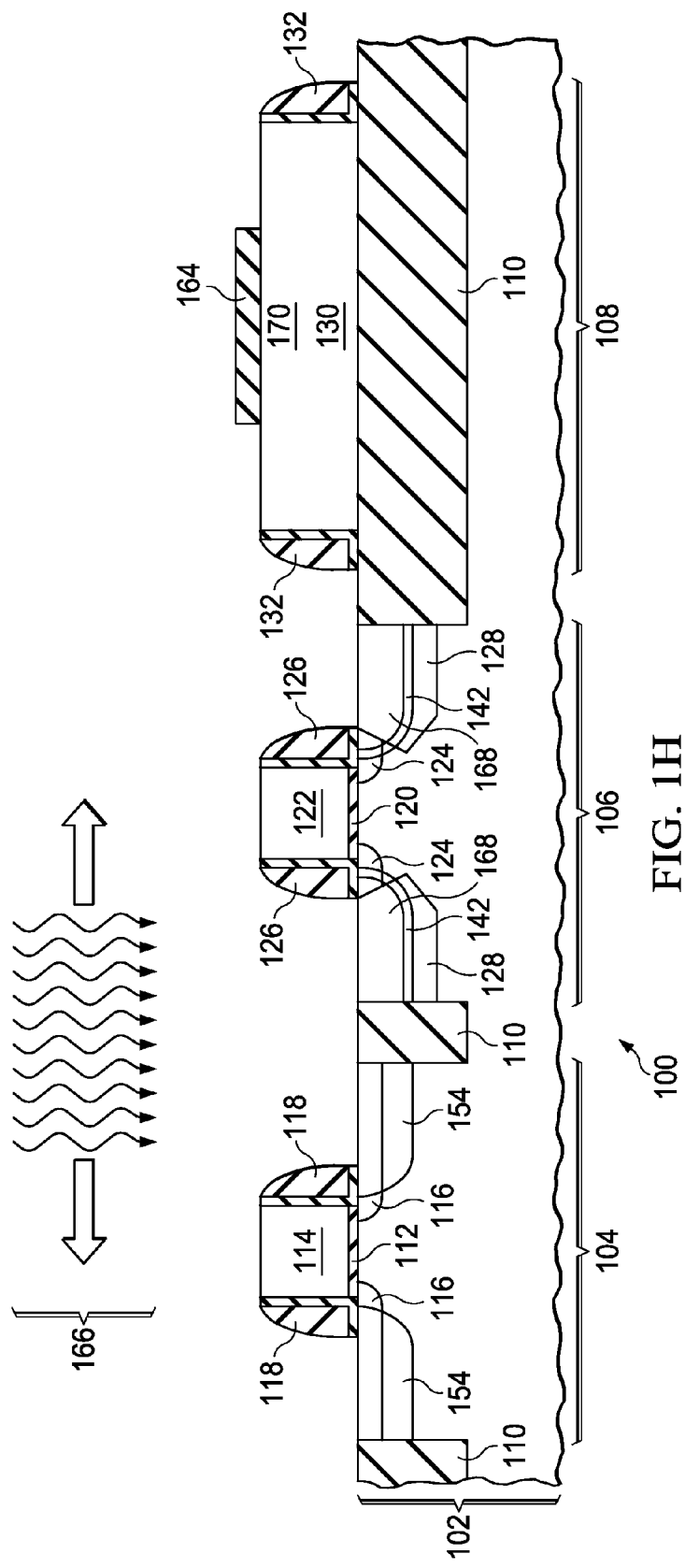

COMBINING ZTCR RESISTOR WITH LASER ANNEAL FOR HIGH PERFORMANCE PMOS TRANSISTOR

CROSS-REFERENCE TO RELATED APPLICATIONS

This is a continuation of U.S. patent application Ser. No. 13/709,961 filed Dec. 10, 2012, which claims the benefit of priority under U.S.C. §119(e) of U.S. Provisional Application No. 61/568,415.

FIELD OF THE INVENTION

This invention relates to the field of integrated circuits. More particularly, this invention relates to resistors and MOS transistors in integrated circuits.

BACKGROUND OF THE INVENTION

P-channel metal oxide semiconductor (PMOS) transistors in integrated circuits fabricated using advanced technology nodes, such as the 65 nanometer node and beyond, face a tradeoff between series resistance and control of the effective channel length. Increasing the boron dose in the p-channel source drain (PSD) implant will desirably reduce the series resistance of the PMOS transistor, but will worsen control of the effective channel length due to diffusion of the boron (overrun) into the channel during the stress memorization technique (SMT) anneal. Reducing the boron dose will increase control of the effective channel length but will worsen the series resistance. Attaining a desired value of series resistance while maintaining a desired level of effective channel length control may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing a PMOS transistor may be formed by implanting boron in the PSD implant step at a dose consistent with effective channel length control, annealing the PSD implant, and subsequently concurrently implanting boron into a polysilicon resistor with a zero temperature coefficient of resistance (ZTCR) using an implant mask which also exposes the PMOS transistor, followed by a millisecond anneal.

DESCRIPTION OF THE VIEWS OF THE DRAWING

FIG. 1A through FIG. 1I are cross sections of an integrated circuit, depicted in successive stages of fabrication.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing a PMOS transistor may be formed by implanting boron in the PSD implant step at a dose consistent with effective channel length control, annealing the PSD implant, and subsequently concurrently implanting boron into a polysilicon resistor with a zero temperature coefficient of resistance (ZTCR) using an implant mask which also exposes the PMOS transistor, followed by a millisecond anneal, such as a laser anneal.

Deposition and patterning of a silicide block dielectric layer may be performed between the ZTCR implant and subsequent anneal, may be performed after the anneal, or may be split before and after the anneal. Implanting boron into the PMOS transistor during the ZTCR implant advantageously reduces a series resistance of the PMOS transistor while using a millisecond anneal prevents undue diffusion of the boron into the channel and thus desirably maintains effective channel length control.

Figure 1A:
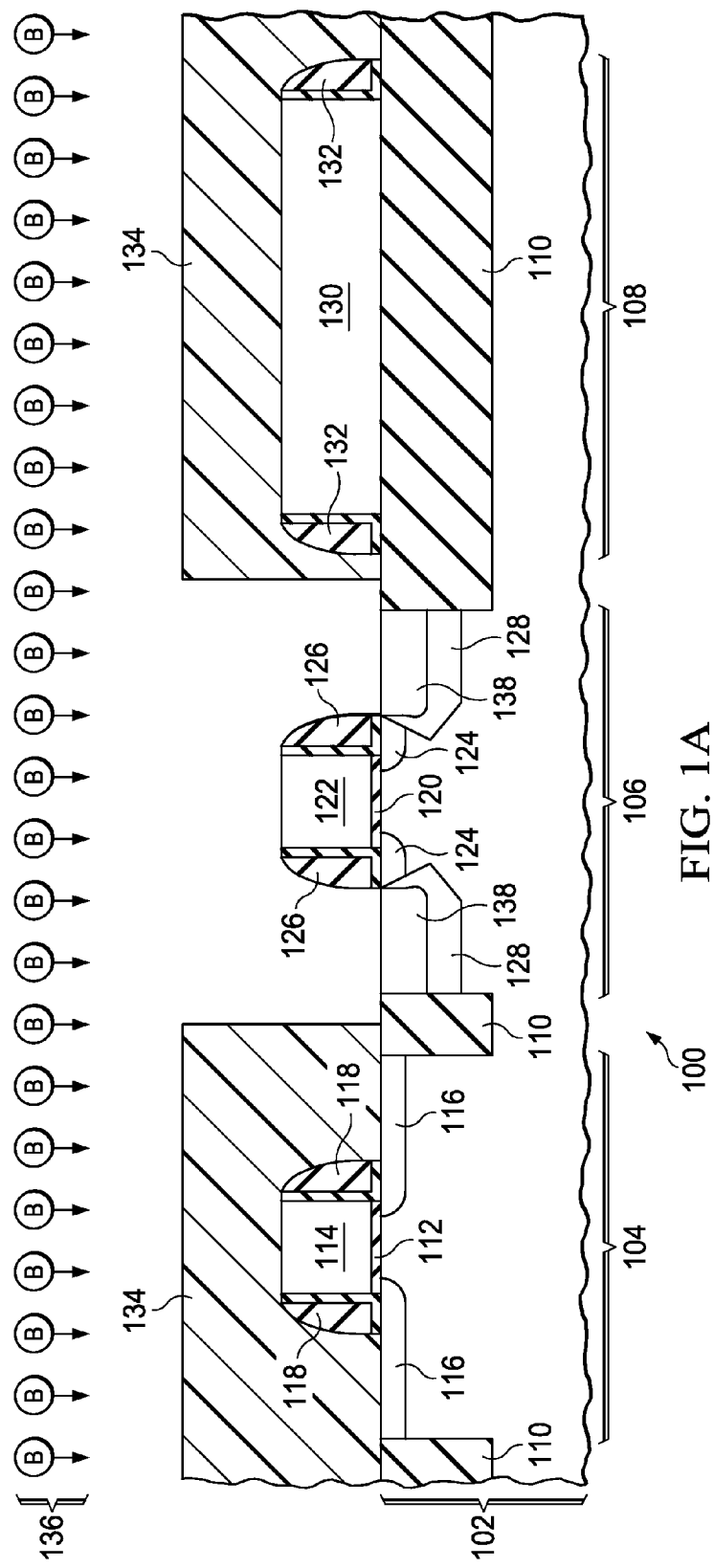

FIG. 1A through FIG. 1I are cross sections of an integrated circuit, depicted in successive stages of fabrication. Referring to FIG. 1A, the integrated circuit 100 is formed in and on a semiconductor substrate 102, for example a silicon wafer, silicon-on-insulator (SOI) wafer, hybrid orientation technology (HOT) wafer, or other substrate suitable for fabrication of the integrated circuit 100. The integrated circuit 100 includes an n-channel metal oxide semiconductor (NMOS) area 104 for an NMOS transistor, a PMOS area 106 for a PMOS transistor, and a ZTCR area 108 for a ZTCR resistor. Field oxide 110, for example formed by a shallow trench isolation (STI) process, may laterally isolate the NMOS area 104 from the PMOS area 106 and may underlie the ZTCR area 108.

The NMOS area 104 includes a gate dielectric layer 112, a polysilicon gate 114, n-channel lightly doped drain (NLDD) regions 116 and gate sidewall spacers 118. The PMOS area 106 includes a gate dielectric layer 120, a polysilicon gate 122, p-channel lightly doped drain (PLDD) regions 124, gate sidewall spacers 126 and possibly silicon-germanium (SiGe) epitaxial source/drain regions 128. In one version of the instant example, the polysilicon gate 114 of the NMOS area 104 and the polysilicon gate 122 of the PMOS area 106 may each have a physical gate length less than 60 nanometers. The ZTCR area 108 includes a polysilicon resistor body 130 and sidewall spacers 132.

A PSD implant mask 134 is formed over an existing top surface of the integrated circuit 100 so as to expose the PMOS area 106 and cover the NMOS area 104 and the ZTCR area 108. The PSD implant mask 134 may include photoresist formed using a photolithographic process. A PSD implant operation 136 is performed which implants boron into the substrate 102 in the PMOS area 106 adjacent to the gate sidewall spacers 126 to form first PSD implanted regions 138 in the substrate 102 and an implanted section of the polysilicon gate 122. A dose of the PSD implant operation 136 may be selected to provide desired control of an effective channel length of the PMOS transistor. For example, the dose of the PSD implant operation 136 may be $1 \times 10^{15}$ cm$^{-2}$ to $1 \times 10^{16}$ cm$^{-2}$.

Figure 1B:
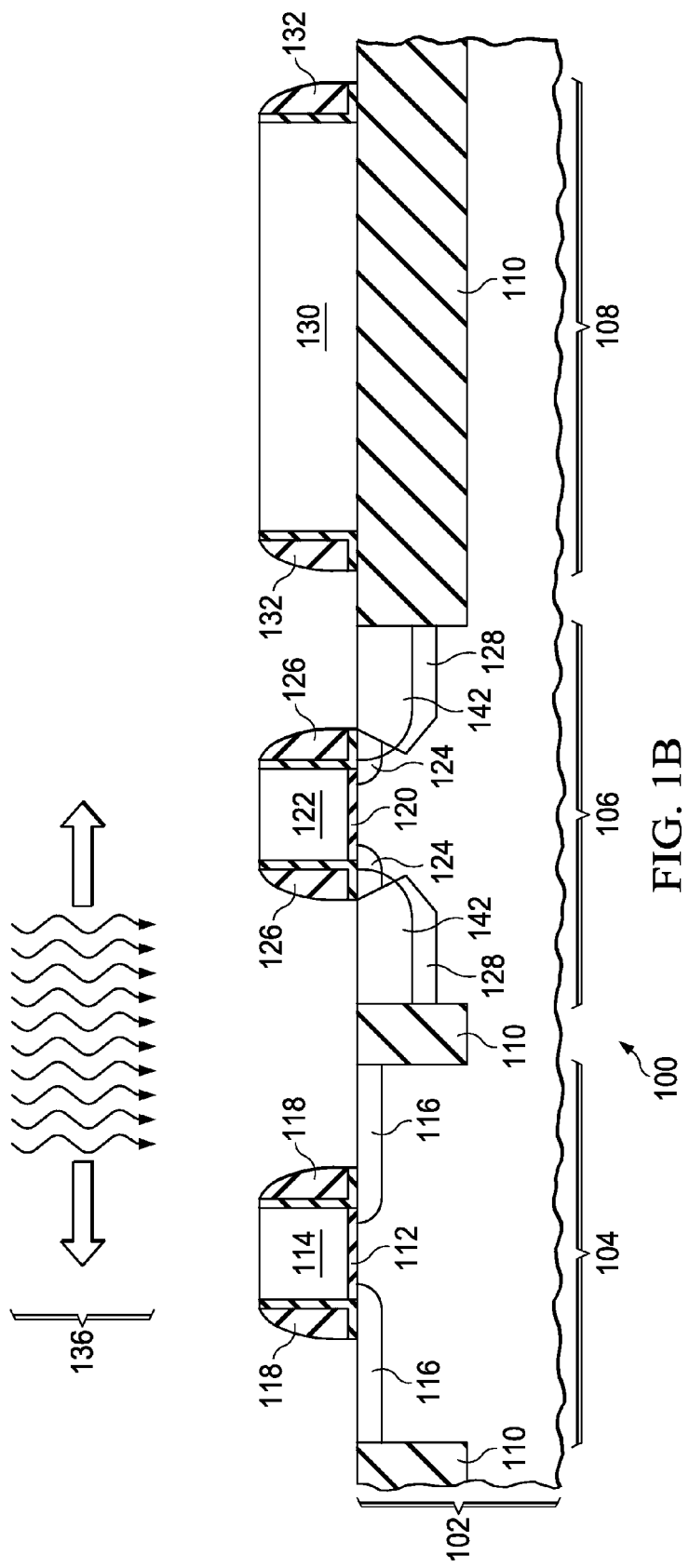

Referring to FIG. 1B, a PSD anneal operation 140 is performed which activates the boron dopants in the first PSD implanted regions 138 of FIG. 1A to form first PSD regions 142 in the substrate 102 adjacent to the polysilicon gate 122 of the PMOS area 106. Boron in the implanted section of the polysilicon gate 122 of the PMOS area 106 diffuses throughout the polysilicon gate 122. The PSD anneal operation 140 may include, for example, a scanned laser anneal operation in which a laser beam is scanned over an existing top surface of the integrated circuit 100 as depicted in FIG. 1B, so that the substrate 102 at the existing top surface of the integrated circuit 100 is heated to 1200° C. to 1260° C. for less than 10 milliseconds. Alternatively, the PSD anneal operation 140 may be a spike anneal which heats the whole existing top surface of the integrated circuit 100 concurrently, for example to 1050° C. to 1150° C. for approximately one second. Further, the PSD anneal operation 140 may include a combination of a laser anneal and a spike anneal.

Figure 1C:
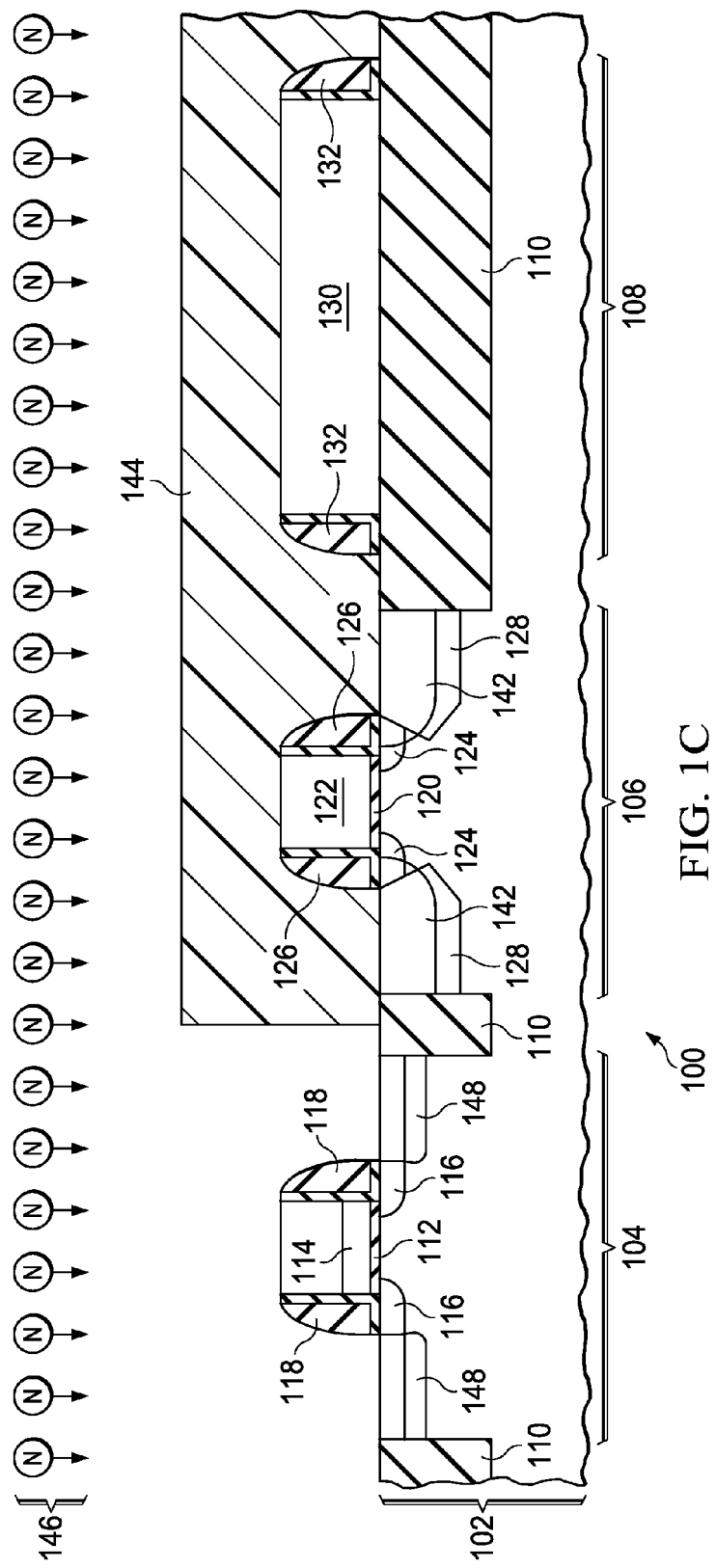

Referring to FIG. 1C, an n-channel source drain (NSD) implant mask 144 is formed over an existing top surface of the integrated circuit 100 so as to expose the NMOS area 104 and cover the PMOS area 106 and the ZTCR area 108. The NSD implant mask 144 may formed in a manner similar to the PSD implant mask 134 of FIG. 1A. An NSD implant operation 146 is performed which implants n-type dopants such as phosphorus and arsenic into the substrate 102 in the NMOS area 104 adjacent to the gate sidewall spacers 118 to form NSD implanted regions 148 in the substrate 102 and implanted section of the polysilicon gate 114. The implanted section of the polysilicon gate 114 is at least partially amorphized by the NSD implant operation 146. An exemplary total dose of the NSD implant operation 146 may be $3 \times 10^{15}$ cm$^{-2}$ to $1 \times 10^{16}$ cm$^{-2}$.

Figure 1D:
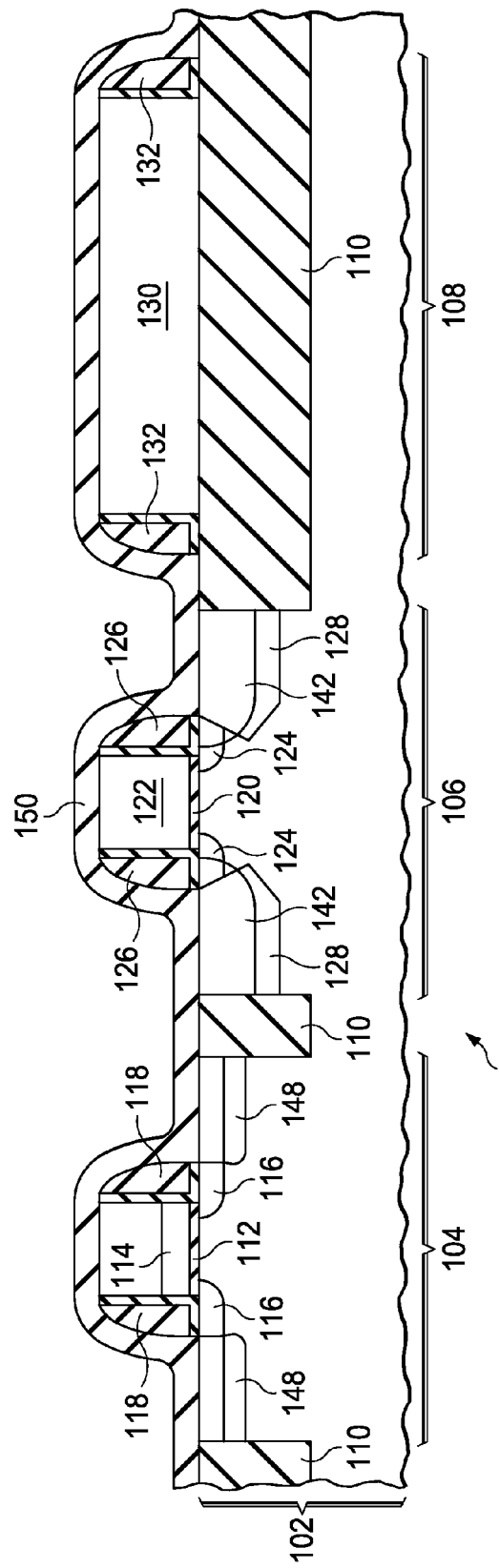

Referring to FIG. 1D, a SMT dielectric layer 150 is formed over an existing top surface of the integrated circuit 100. The SMT dielectric layer 150 may be, for example, 15 to 50 nanometers of silicon dioxide and silicon nitride, with compressive or tensile stress above 100 megapascals. Portions of the SMT dielectric layer 150 in the NMOS area 104 or PMOS area 106 may be altered by implant/anneal to modify the stress. Parts of the SMT dielectric layer 150 above either the NMOS area 104 or PMOS area 106 may be removed by pattern and etch.

Figure 1E:
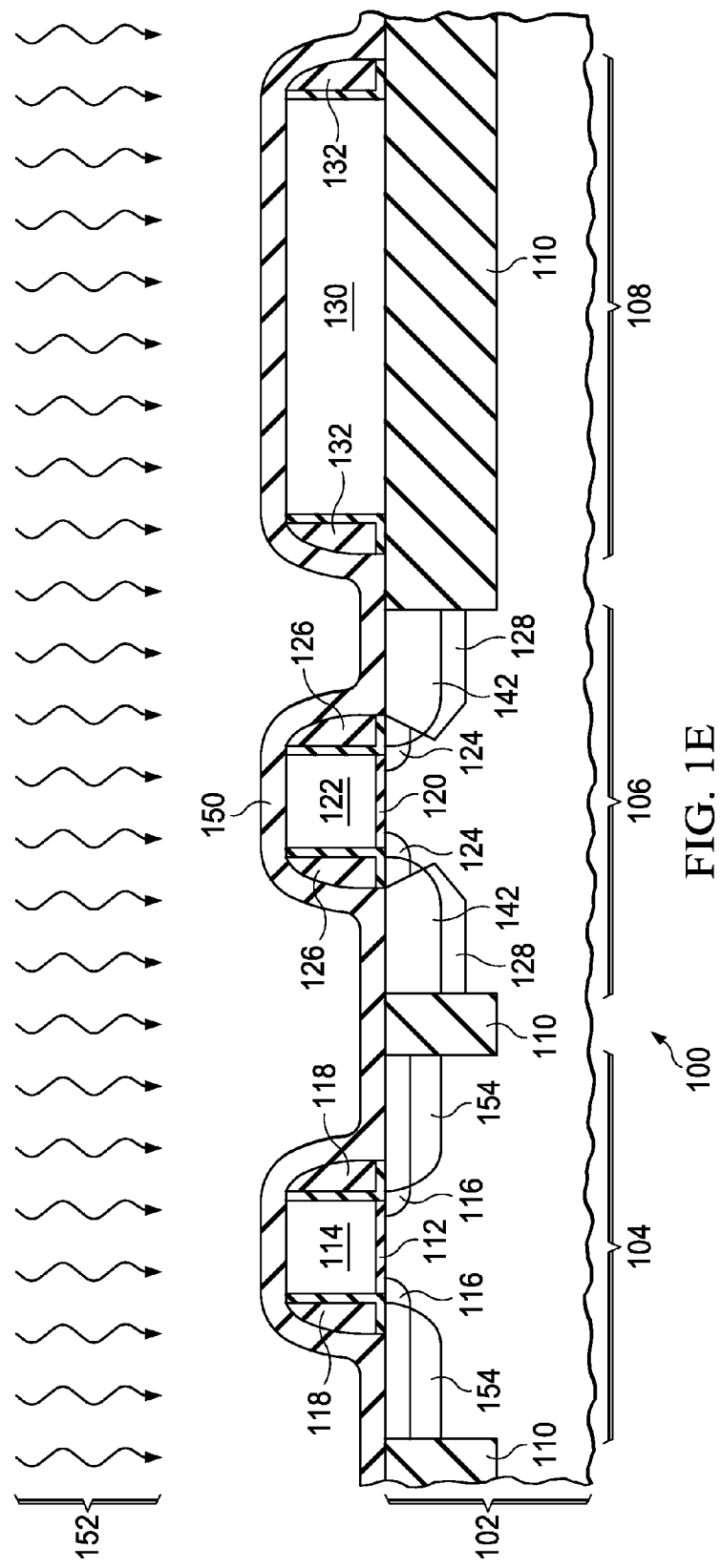

Referring to FIG. 1E, an NSD anneal operation 152 is performed which activates the n-type dopants in the NSD implanted regions 148 to form NSD regions 154 in the substrate 102 adjacent to the polysilicon gate 118 of the NMOS area 104. The at least partially amorphized implanted section of the polysilicon gate 114 of the NMOS area 104 is recrystallized by the NSD anneal operation 152. The NSD anneal operation 152 may include, for example, a spike anneal which heats the whole existing top surface of the integrated circuit 100 concurrently, for example to 1050° C. to 1150° C. for approximately one second. Alternatively, the NSD anneal operation 152 may include an ultra high temperature (UHT) millisecond anneal, such as a laser anneal, as described in reference to FIG. 1B. The SMT dielectric layer 150 is removed after the NSD anneal operation 152 is completed. The SMT dielectric layer 150 may be removed, for example, using a wet etch of phosphoric acid to remove the silicon nitride and a dilute buffered wet etch of hydrofluoric acid to remove the silicon dioxide.

Figure 1F:
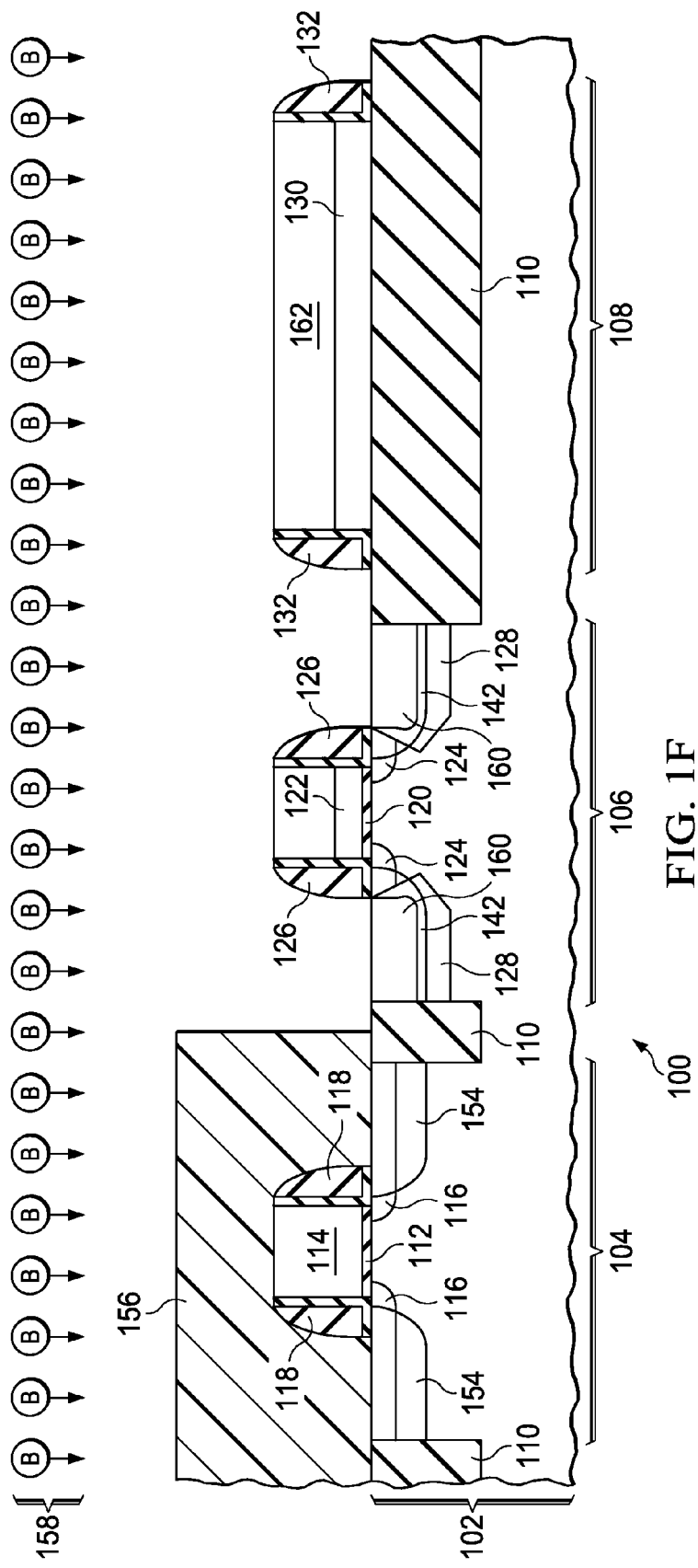

Referring to FIG. 1F, a ZTCR implant mask 156 is formed over an existing top surface of the integrated circuit 100 so as to expose the PMOS area 106 and the ZTCR area 108 and cover the NMOS area 104. The ZTCR implant mask 156 may be formed in a similar manner to the PSD implant mask 134 and/or the NSD implant mask 144. A ZTCR implant operation 158 is performed which implants boron at a dose of at least $1 \times 10^{15}$ cm$^{-2}$ into the substrate 102 in the first PSD regions 142 to form second PSD implanted regions 160 and into the polysilicon resistor body 130 to form a resistor implanted region 162. The ZTCR implant operation 158 also forms an implanted section of the polysilicon gate 122 in the PMOS area 106. A dose of the ZTCR implant operation 158 may be selected to provide a desired low temperature coefficient for the ZTCR resistor. In one version of the instant example, the dose of the ZTCR implant operation 158 may be at least $5 \times 10^{15}$ cm$^{-2}$. In a further version, the dose of the ZTCR implant operation 158 may be at least $1 \times 10^{16}$ cm$^{-2}$.

Figure 1G:
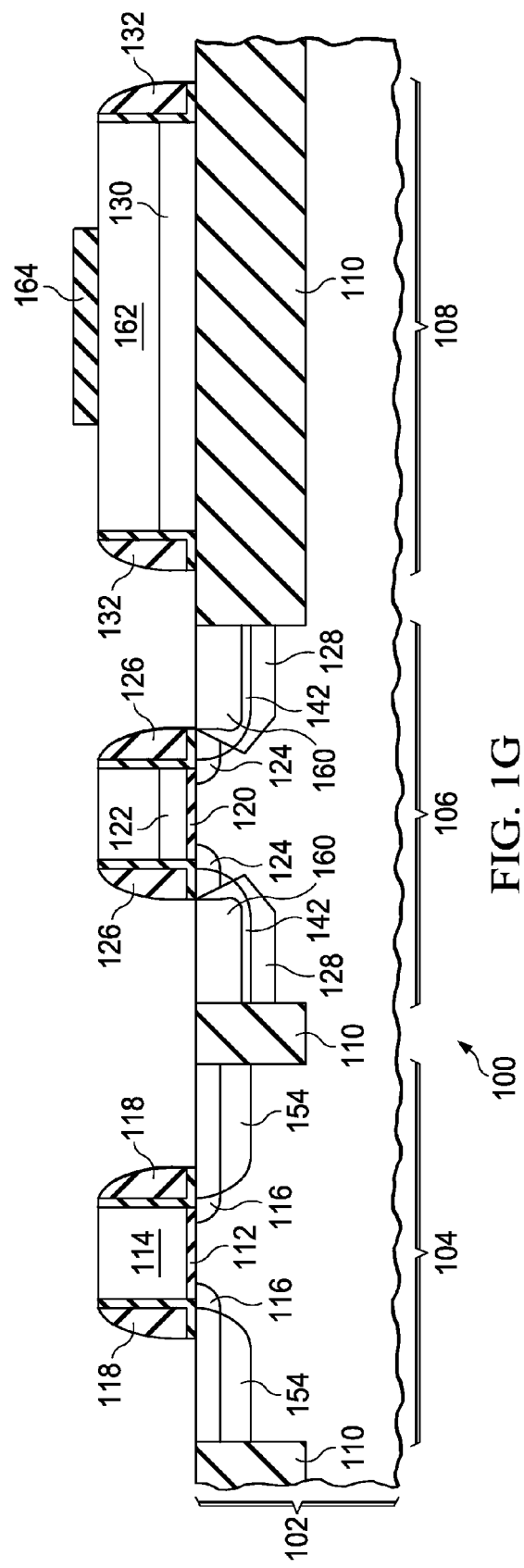

Referring to FIG. 1G, a silicide block dielectric layer is formed over an existing top surface of the integrated circuit 100 and patterned to form a resistor body silicide block 164 over the polysilicon resistor body 130. The resistor body silicide block 164 may include, for example, one or more layers of silicon dioxide and/or silicon nitride with a total thickness of 10 to 100 nanometers.

Referring to FIG. 1H, a ZTCR anneal operation 166 is performed which activates the implanted boron in the PSD implanted regions 160 to form second PSD regions 168 and activates the implanted boron in the resistor implanted region 162 to form a ZTCR resistor 170. The implanted boron in the implanted section of the polysilicon gate 122 of the PMOS area 106 diffuses throughout the polysilicon gate 122. The ZTCR anneal operation 166 heats the PSD implanted regions 160 and the resistor implanted region 162 at a temperature of at least 1200° C. for less than 10 milliseconds. In one version of the instant example, the ZTCR anneal operation 166 is less than 1 millisecond at the temperature of at least 1200° C. In a further version, the ZTCR anneal operation 166 is less than 1 millisecond at a temperature of at least 1250° C. The ZTCR anneal operation 166 may be a scanned laser anneal operation as discussed in reference to the PSD anneal operation 140. Annealing the PSD implanted regions 160 advantageously prevents significant diffusion of the implanted boron into a channel of the PMOS transistor, maintaining control of the effective channel length. Including the PMOS transistor in the ZTCR implant advantageously reduces a series resistance of the PMOS transistor.

Figure 1I:
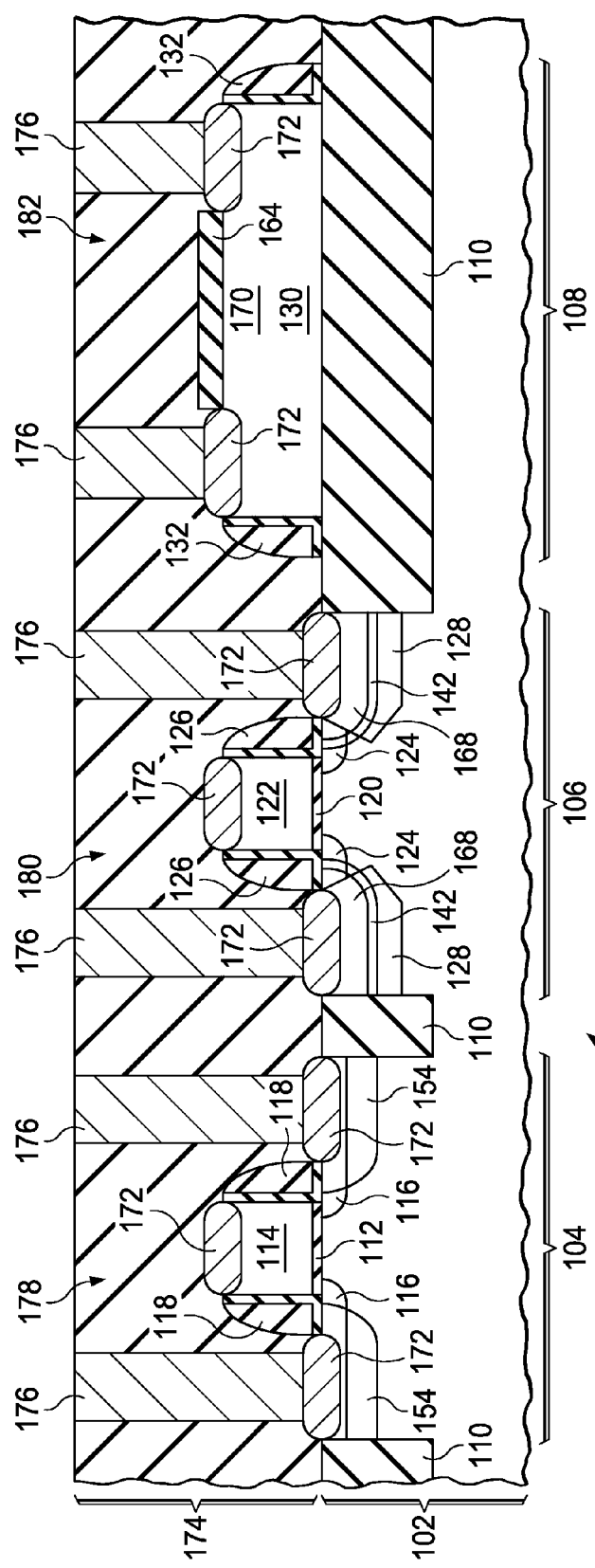

Referring to FIG. 1I, metal silicide 172 is formed at the top surface of the substrate 102 on the NSD regions 154 and the first and second PSD regions 142 and 168, and at top surfaces of the polysilicon gate 114 in the NMOS area 104 and the polysilicon gate 122 in the PMOS area 106 and at a top surface of the polysilicon resistor body 130 in areas exposed by the resistor body silicide block 164. the metal silicide 172 may be formed, for example, by depositing a layer of metal, such as titanium, cobalt, platinum, tantalum, nickel, palladium or molybdenum on an existing top surface of the integrated circuit 100, heating the integrated circuit 100 to react a portion of the metal with exposed silicon in active areas of the integrated circuit 100, and selectively removing unreacted metal from the integrated circuit 100 surface, commonly by exposing the integrated circuit 100 to wet etchants including a mixture of an acid and hydrogen peroxide.

A pre-metal dielectric (PMD) layer 174 is formed over an existing top surface of the integrated circuit 100. The PMD layer 174 is a dielectric layer stack including a PMD liner, not shown, a PMD main layer, and an optional PMD cap layer, not shown. The PMD liner is commonly silicon nitride or silicon dioxide, 10 to 100 nanometers thick, deposited by PECVD on the existing top surface of the integrated circuit 100. The PMD main layer is commonly a layer of silicon dioxide formed by a HARP process followed by a layer of silicon dioxide, phospho-silicate glass (PSG) or boro-phospho-silicate glass (BPSG), commonly 100 to 1000 nanometers thick, deposited by a PECVD process on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer.

Contacts 176 are formed in the PMD layer 174 to make electrical contact to the NMOS transistor 178, the PMOS transistor 180 and the ZTCR resistor 182. The contacts 176 may be formed, for example, by defining contact areas on a top surface of the PMD layer 174 with a contact photoresist pattern, etching contact holes in the contact areas by removing PMD layer material using reactive ion etching methods to expose the metal silicide layers 172, and filling the contact holes with a contact liner metal, such as a dual layer of titanium and titanium nitride, and a contact fill metal, such as tungsten, followed by removal of the contact fill metal and contact liner metal from the top surface of the PMD layer 174 using plasma etching and/or CMP methods.

Figure 2A:
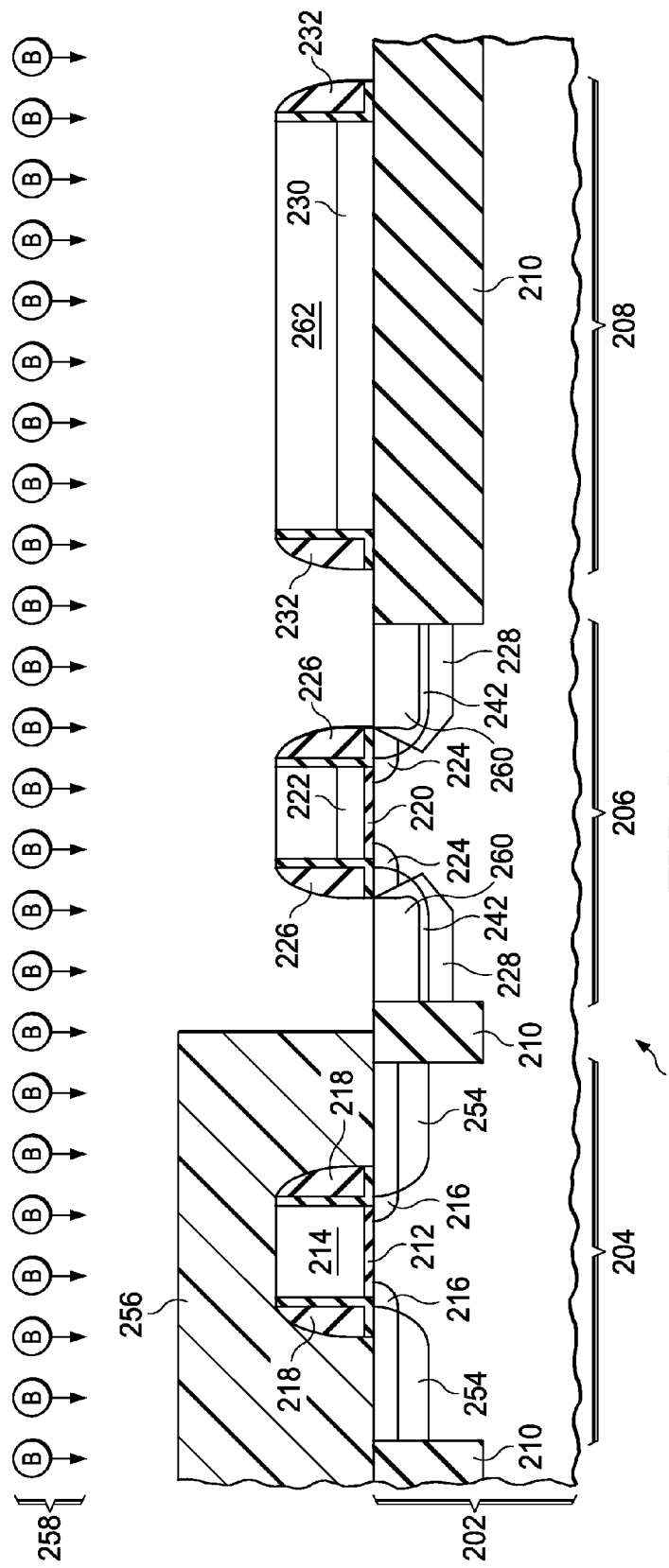
FIG. 2A through FIG. 2D are cross sections of another integrated circuit depicted in successive stages of fabrication.

FIG. 2A through FIG. 2D are cross sections of another integrated circuit depicted in successive stages of fabrication. Referring to FIG. 2A, the integrated circuit 200 is formed in and on a semiconductor substrate 202 and includes an NMOS area 204 for an NMOS transistor, a PMOS area 206 for a PMOS transistor, and a ZTCR area 208 for a ZTCR resistor, as described in reference to FIG. 1A. Field oxide 210 may laterally isolate the NMOS area 204 from the PMOS area 206 and may underlie the ZTCR area 208.

The NMOS area 204 includes a gate dielectric layer 212, a polysilicon gate 214, NLDD regions 216 and gate sidewall spacers 218. The NMOS area 204 further includes NSD regions 254, which may be formed as described in reference to FIG. 1C through FIG. 1E. The PMOS area 206 includes a gate dielectric layer 220, a polysilicon gate 222, PLDD regions 224, gate sidewall spacers 226 and possibly silicon-germanium (SiGe) epitaxial source/drain regions 228. The PMOS area 206 further includes first PSD regions 242 as described in reference to FIG. 1A and FIG. 1B. In one version of the instant example, the polysilicon gate 214 of the NMOS area 204 and the polysilicon gate 222 of the PMOS area 206 may each have a physical gate length less than 60 nanometers. The ZTCR area 108 includes a polysilicon resistor body 230 and sidewall spacers 232.

A ZTCR implant mask 256 is formed over an existing top surface of the integrated circuit 200 so as to expose the PMOS area 206 and the ZTCR area 208 and cover the NMOS area 204. The ZTCR implant mask 256 may be formed in a similar manner to the PSD implant mask 134 of FIG. 1A and/or the NSD implant mask 144 of FIG. 1C. A ZTCR implant operation 258 is performed which implants boron into the substrate 202 in the first PSD regions 242 to form second PSD implanted regions 260 and into the polysilicon resistor body 230 to form a resistor implanted region 262. The ZTCR implant operation 258 also forms an implanted section of the polysilicon gate 222 in the PMOS area 206. A dose of the ZTCR implant operation 258 may be selected to provide a desired low temperature coefficient for the ZTCR resistor, as described in reference to FIG. 1F.

Figure 2B:
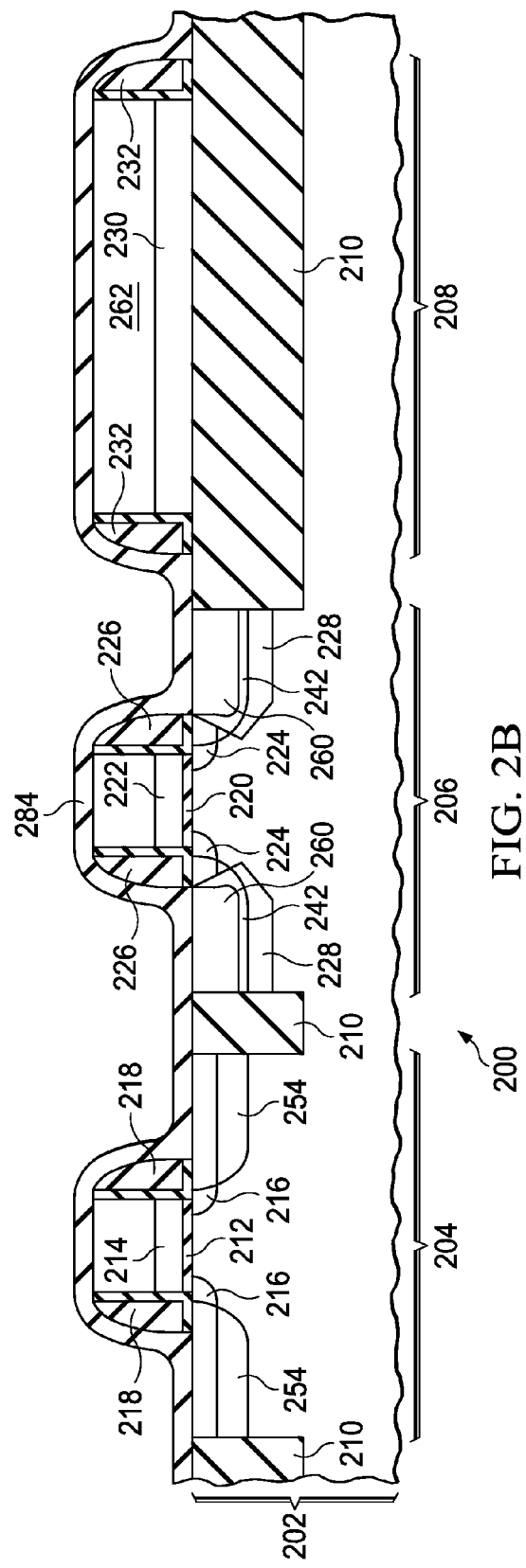

Referring to FIG. 2B, a silicide block dielectric layer 284 is formed over an existing top surface of the integrated circuit 200. The silicide block dielectric layer 284 may be, for example one or more layers of silicon dioxide and/or silicon nitride with a total thickness of 10 to 100 nanometers. A silicon dioxide layer in the silicide block dielectric layer 284 may be formed, for example, with a plasma enhanced chemical vapor deposition (PECVD) process using tetraethyl orthosilicate, also known as tetraethoxysilane or TEOS. A silicon nitride layer in the silicide block dielectric layer 284 may be formed, for example, with a PECVD process using bis (tertiary-butylamino) silane (BTBAS). The silicide block dielectric layer 284 may optionally be formed to have compressive stress above 100 megapascals so as to advantageously provide a PMOS SMT effect, which may increase a drive current of the PMOS transistor.

Figure 2C:
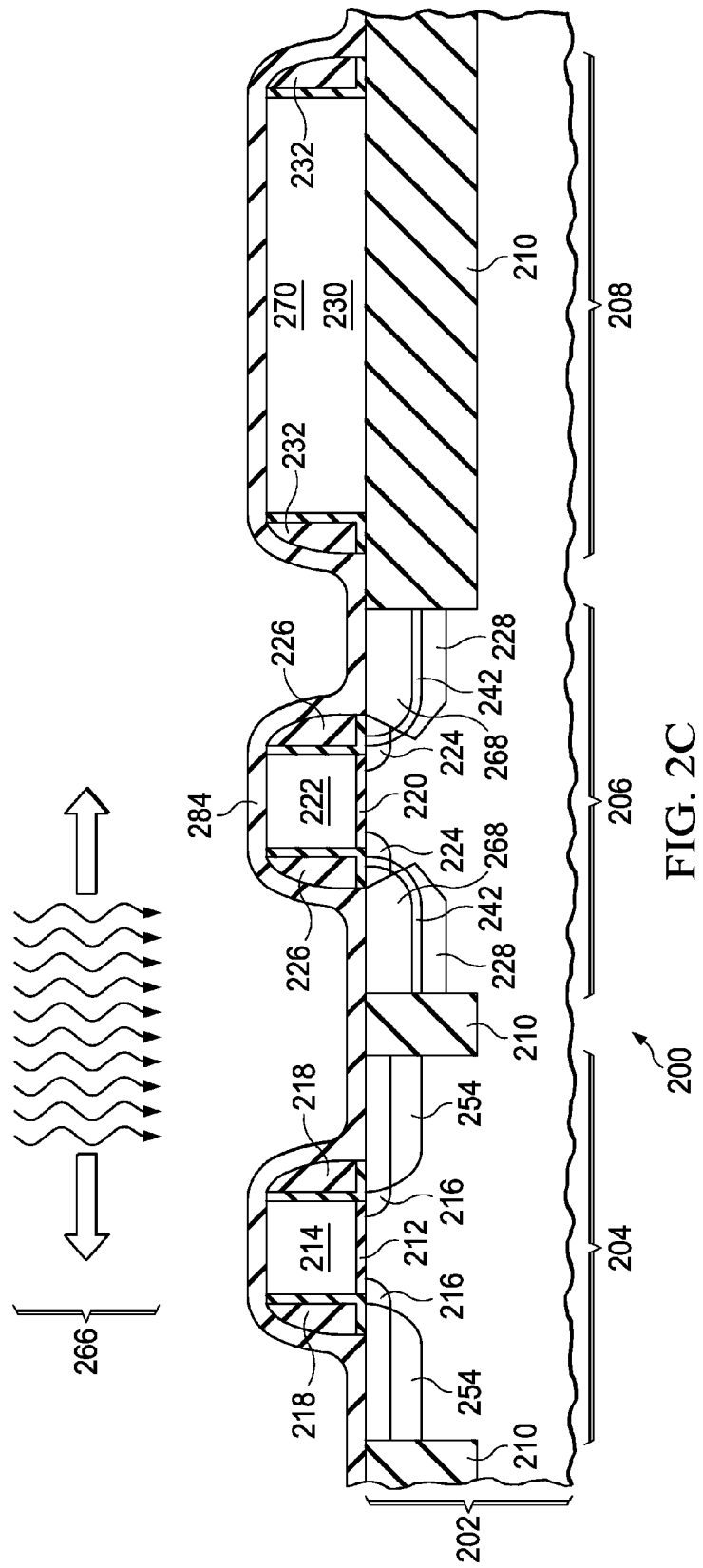

Referring to FIG. 2C, a ZTCR anneal operation 266 is performed, as described in reference to FIG. 1H, which activates the implanted boron in the PSD implanted regions 260 to form second PSD regions 268 and activates the implanted boron in the resistor implanted region 262 to form a ZTCR resistor 270. The implanted boron in the implanted section of the polysilicon gate 222 of the PMOS area 206 diffuses throughout the polysilicon gate 222.

Figure 2D:
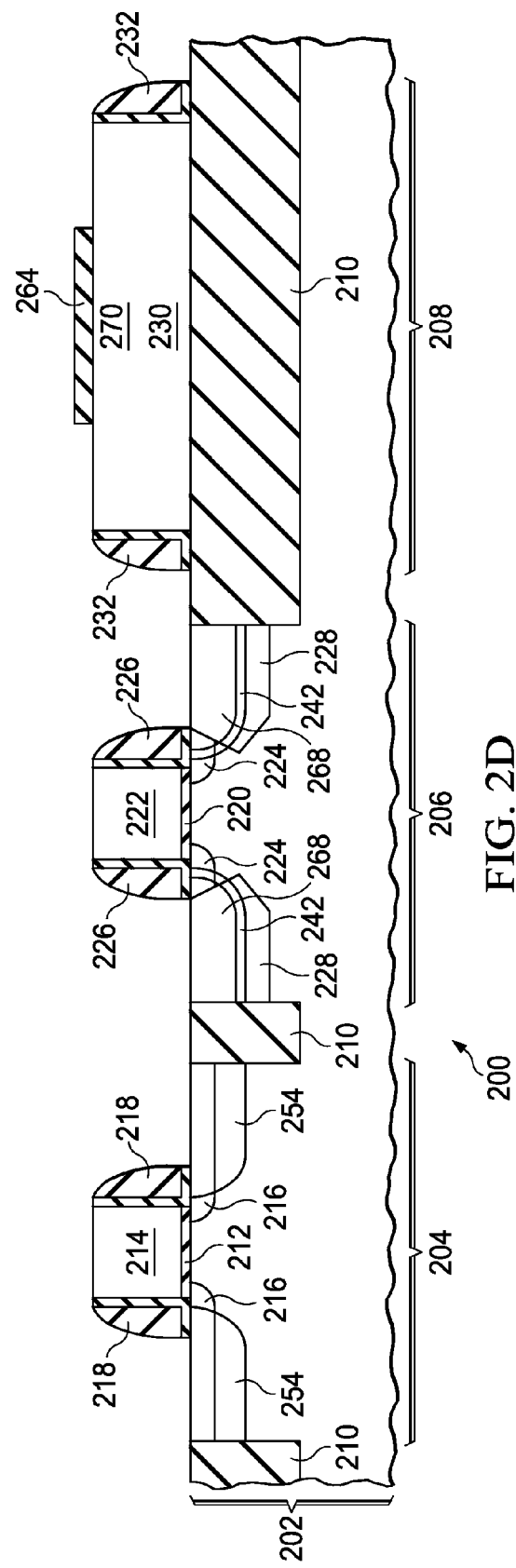

Referring to FIG. 2D, the silicide block dielectric layer 284 of FIG. 2B is patterned to form a resistor body silicide block 264 over the polysilicon resistor body 230. Patterning may be accomplished, for example, by forming an etch mask of photoresist over the silicide block dielectric layer 284 using a photolithographic process so as to cover an area defined for the resistor body silicide block 264, and etching the exposed silicide block dielectric layer 284 using an RIE process with fluorine and oxygen radicals. After the resistor body silicide block 264 is formed, metal silicide, a PMD layer and contacts are formed as described in reference to FIG. 1I.

Figure 3A:
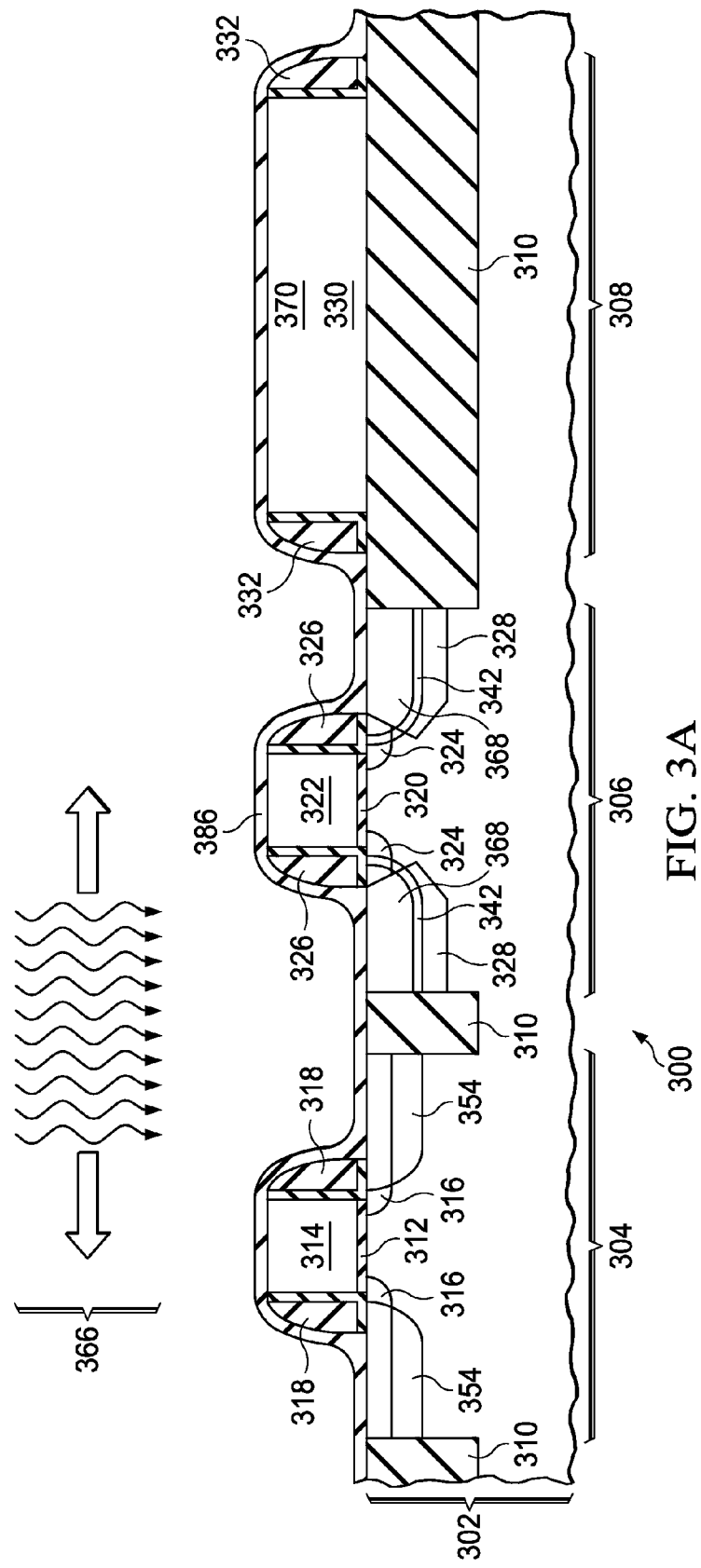
FIG. 3A and FIG. 3B are cross sections of a further integrated circuit depicted in successive stages of fabrication.
Figure 3B:
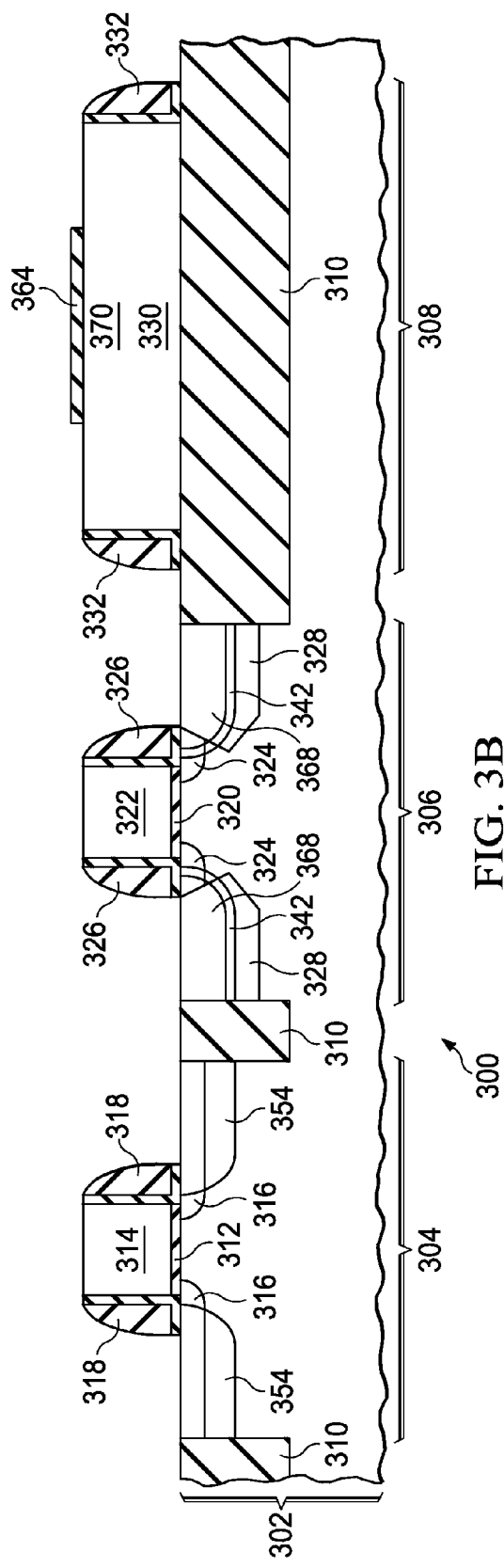

FIG. 3A and FIG. 3B are cross sections of a further integrated circuit depicted in successive stages of fabrication. Referring to FIG. 3A, the integrated circuit 300 is formed in and on a semiconductor substrate 302 and includes an NMOS area 304 for an NMOS transistor, a PMOS area 306 for a PMOS transistor, and a ZTCR area 308 for a ZTCR resistor, as described in reference to FIG. 1A. Field oxide 310 may laterally isolate the NMOS area 304 from the PMOS area 306 and may underlie the ZTCR area 308.

The NMOS area 304 includes a gate dielectric layer 312, a polysilicon gate 314, NLDD regions 316 and gate sidewall spacers 318. The NMOS area 304 further includes NSD regions 354, which may be formed as described in reference to FIG. 1C through FIG. 1E. The PMOS area 306 includes a gate dielectric layer 320, a polysilicon gate 322, PLDD regions 324, gate sidewall spacers 326 and possibly silicon-germanium (SiGe) epitaxial source/drain regions 328. The PMOS area 306 further includes first PSD regions 342 as described in reference to FIG. 1B and an implanted section of the polysilicon gate 322 and second PSD implanted regions as described in reference to FIG. 1F. In one version of the instant example, the polysilicon gate 314 of the NMOS area 304 and the polysilicon gate 322 of the PMOS area 306 may each have a physical gate length less than 60 nanometers. The ZTCR area 308 includes a polysilicon resistor body 330, sidewall spacers 332 and a resistor implanted region in the polysilicon resistor body 330 as described in reference to FIG. 1F.

An optional dielectric layer 386 may be formed over an existing top surface of the integrated circuit 300 to advantageously retain dopants during a subsequent ZTCR anneal operation 366. The dielectric layer 386 may include, for example, 5 to 50 nanometers of silicon dioxide formed by PECVD using TEOS.

The ZTCR anneal operation 366 is performed, as described in reference to FIG. 1H, which activates the implanted boron in the PSD implanted regions 360 to form second PSD regions 368 and activates the implanted boron in the resistor implanted region 362 to form a ZTCR resistor 370. The implanted boron in the implanted section of the polysilicon gate 322 of the PMOS area 306 diffuses throughout the polysilicon gate 322.

Referring to FIG. 3B, a silicide block dielectric layer is formed over an existing top surface of the integrated circuit 300 and patterned to form a resistor body silicide block 364 over the polysilicon resistor body 330. The resistor body silicide block 364 may be formed as described in reference to FIG. 2B and FIG. 2D. After the resistor body silicide block 264 is formed, metal silicide, a PMD layer and contacts are formed as described in reference to FIG. 1I.

Figure 4A:
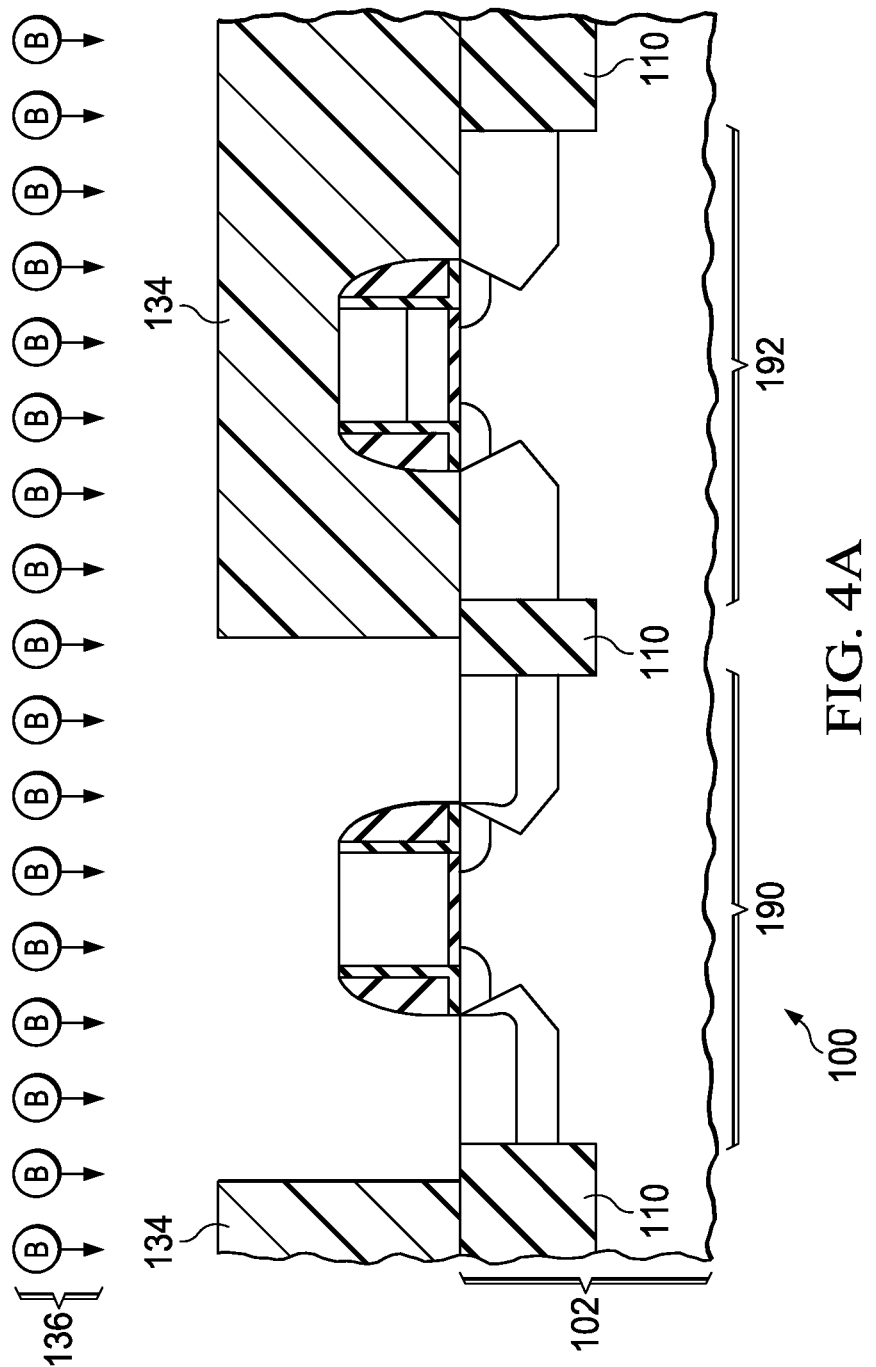
FIG. 4A and FIG. 4B depict addition PMOS transistors during fabrication.
Figure 4B:
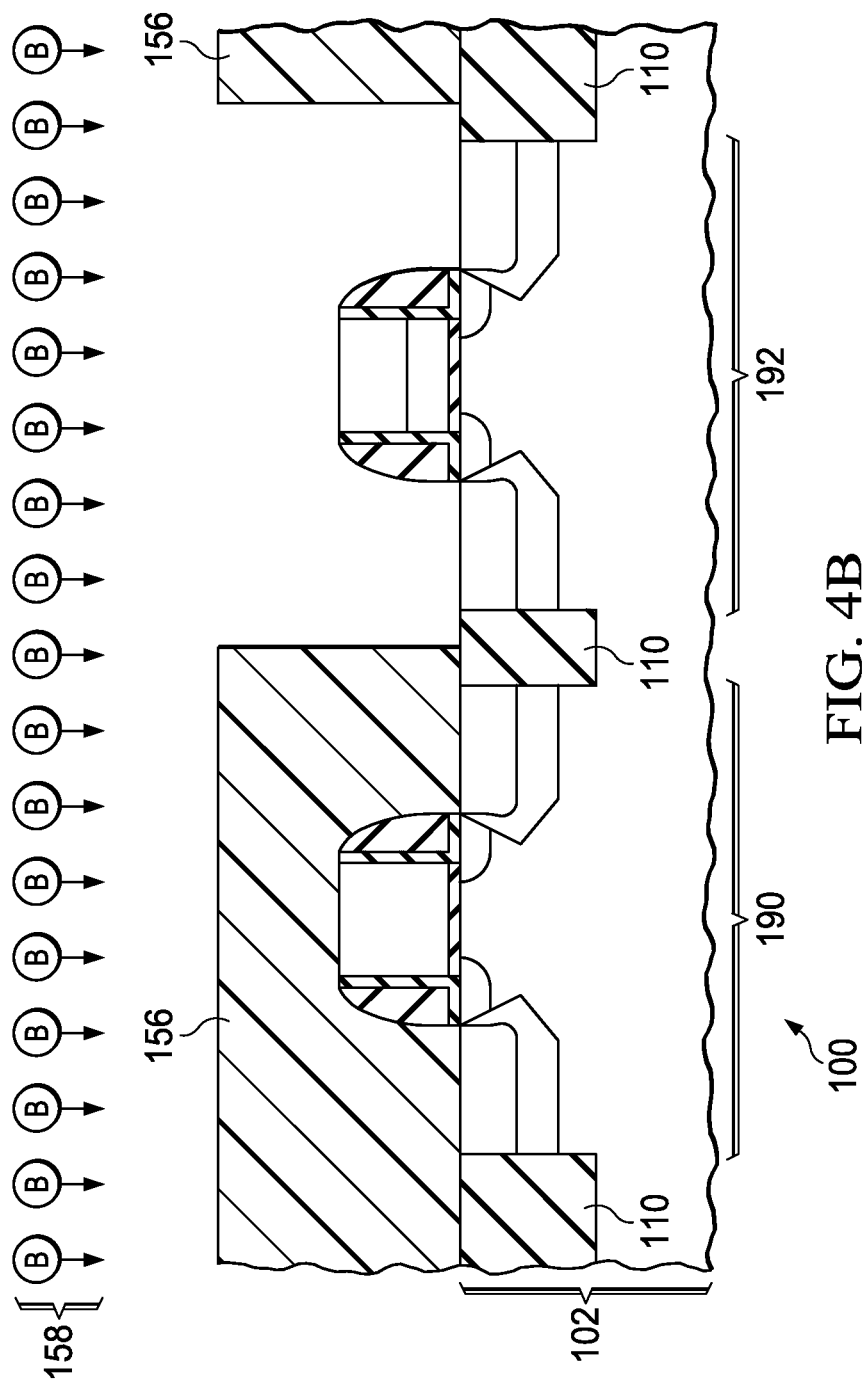

The examples described above may be carried out so that a subset of PMOS transistors in an integrated circuit receive the PSD implant and the ZTCR implant, while other PMOS transistors in the integrated circuit receive only the PSD implant. Alternatively, a subset of PMOS transistors in an integrated circuit receive the PSD implant and the ZTCR implant, while other PMOS transistors in the integrated circuit receive only the ZTCR implant or three subsets of PMOS transistors may be used: one subset receiving the PSD implant and the ZTCR implant, one subset receiving the PSD implant only, and one subset receiving the ZTCR implant only. FIG. 4A illustrates optional PMOS transistor 190 and optional PMOS transistor 192 located in a separate location of integrated circuit 100 at the same fabrication step as illustrated in FIG. 1A. PMOS transistor 190 receives the PSD implant 136 while PMOS transistor 192 blocked from PSD implant 136 by mask 134. FIG. 4B illustrates PMOS transistor 190 and PMOS transistor 192 at the same fabrication step as illustrated in FIG. 1F. PMOS transistor 190 is blocked from receiving ZTCR implant 158 by mask 156 while PMOS transistor 192 receives the ZTCR implant 158. Forming the integrated circuit to have two or three types of PMOS transistors as determined by the total dose in the source and drain regions may advantageously provide different functional regions in the integrated circuit with desired performance. For example, PMOS transistors in logic circuits may receive the PSD implant and the ZTCR implant to provide a desired speed of the logic circuits while PMOS transistors in a static random access memory (SRAM) may receive only the PSD implant to provide higher static noise margin.

While various examples of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
    providing a substrate comprising a semiconductor material;
    forming an implant mask to expose an area of a p-channel metal oxide semiconductor (PMOS) transistor and cover an area of a polysilicon resistor;
    using the implant mask, implanting boron into the area of the PMOS transistor to form first p-channel source drain (PSD) implanted regions in said substrate adjacent to gate sidewall spacers on a polysilicon gate of said PMOS transistor;
    annealing said first PSD implanted regions to form first PSD regions;
    prior to forming the first PSD implanted regions, forming p-type lightly doped drain (PLDD) regions in the substrate adjacent the polysilicon gate of the PMOS transistor;
    subsequently, concurrently implanting boron into said first PSD regions and a polysilicon resistor body at a dose of at least $1 \times 10^{15}$ cm$^{-2}$; and
    subsequently annealing said PMOS transistor and said polysilicon resistor body for less than 10 milliseconds at a temperature of at least 1200° C.

2. The method of claim 1, further comprising the steps of:
    forming a silicide block dielectric layer over an existing top surface of said integrated circuit, after said step of implanting boron into said first PSD regions and said polysilicon resistor body; and
    patterning said silicide block dielectric layer to form a resistor body silicide block over said polysilicon resistor body, prior to said step of annealing said PMOS transistor and said polysilicon resistor body.

3. The method of claim 1, further comprising the steps of:
    forming a silicide block dielectric layer over an existing top surface of said integrated circuit, after said step of implanting boron into said first PSD regions and said polysilicon resistor body and prior to said step of annealing said PMOS transistor and said polysilicon resistor body; and
    patterning said silicide block dielectric layer to form a resistor body silicide block over said polysilicon resistor body, after said step of annealing said PMOS transistor and said polysilicon resistor body.

4. The method of claim 3, in which said silicide block dielectric layer has tensile stress above 100 megapascals.

5. The method of claim 1, further comprising the steps of:
    forming a silicide block dielectric layer over an existing top surface of said integrated circuit, after said step of annealing said PMOS transistor and said polysilicon resistor body; and
    subsequently patterning said silicide block dielectric layer to form a resistor body silicide block over said polysilicon resistor body.

6. The method of claim 5, in which said silicide block dielectric layer comprises silicon dioxide.

7. The method of claim 5, further comprising the step of forming a dielectric layer over an existing top surface of said integrated circuit, prior to said step of annealing said PMOS transistor and said polysilicon resistor body, so that said dielectric layer is over said integrated circuit during said step of annealing said PMOS transistor and said polysilicon resistor body.

8. The method of claim 1, in which said step of annealing said first PSD implanted regions is less than 10 milliseconds at a temperature of at least 1200° C.

9. The method of claim 1, in which said step of implanting boron into said first PSD regions and a polysilicon resistor body is performed at a dose of at least $8\times10^{15}$ cm$^{-2}$.

10. The method of claim 1, in which said step of implanting boron into said first PSD regions and a polysilicon resistor body is performed at a dose of at least $1\times10^{16}$ cm$^{-2}$.

11. The method of claim 1, in which said step of annealing said PMOS transistor and said polysilicon resistor body is less than 1 millisecond at said temperature of at least 1200° C.

12. The method of claim 11, in which said step of annealing said PMOS transistor and said polysilicon resistor body is at a temperature of at least 1250° C.

13. The method of claim 1, in which a physical gate length of said polysilicon gate of said PMOS transistor is less than 60 nanometers.

14. The method of claim 1, in which said PMOS transistor includes silicon-germanium (SiGe) epitaxial source/drain regions.

15. A method of forming an integrated circuit, comprising the steps of:
providing a substrate comprising a semiconductor material;
implanting boron into an area of a p-channel metal oxide semiconductor (PMOS) transistor to form first p-channel source drain (PSD) implanted regions in said substrate adjacent to gate sidewall spacers on a polysilicon gate of said PMOS transistor while masking the implant from an area of a resistor;
annealing said first PSD implanted regions to form first PSD regions;
subsequently, concurrently implanting boron into said first PSD regions and a polysilicon resistor body at a dose of at least $1\times10^{15}$ cm$^{-2}$;
subsequently annealing said PMOS transistor and said polysilicon resistor body for less than 10 milliseconds at a temperature of at least 1200° C.; and
implanting n-type dopants into said substrate adjacent to gate sidewall spacers on a polysilicon gate of an n-channel metal oxide semiconductor (NMOS) transistor in said integrated circuit, after said step of annealing said first PSD implanted regions, and prior to said step of implanting boron into said first PSD regions and a polysilicon resistor body.

16. The method of claim 15, further comprising the steps of:
forming a stress memorization technique (SMT) dielectric layer over an existing top surface of said integrated circuit, said SMT dielectric layer having compressive stress above 100 megapascals, after said step of implanting n-type dopants into said substrate;
subsequently annealing said NMOS transistor; and
subsequently removing said SMT dielectric layer, prior to said step of implanting boron into said first PSD regions and a polysilicon resistor body.

* * * * *